United States Patent
Yamamoto

(10) Patent No.: US 6,372,528 B1
(45) Date of Patent: Apr. 16, 2002

(54) BURN-IN METHOD AND BURN-IN DEVICE

(75) Inventor: Shigehisa Yamamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/813,801

(22) Filed: Mar. 22, 2001

(30) Foreign Application Priority Data

Sep. 20, 2000 (JP) .......................................... 12-284645

(51) Int. Cl.[7] .............................................. G01R 31/26
(52) U.S. Cl. ........................................ 438/15; 324/760
(58) Field of Search .................... 174/260; 29/843; 438/15, 14; 324/760; 427/134; 338/34

(56) References Cited

U.S. PATENT DOCUMENTS 5,602,491 A * 2/1997 Vasquez ...................... 324/760
5,766,979 A * 6/1998 Budnaitis ...................... 438/15
6,153,894 A * 11/2000 Udagawa ...................... 257/96
2001/0020545 A1 * 9/2001 Eldridge ...................... 174/260

* cited by examiner

Primary Examiner—John F. Niebling
Assistant Examiner—André C Stevenson
(74) Attorney, Agent, or Firm—Oblon, Spivak, McClelland, Maier & Neustadt, P.C.

(57) ABSTRACT

To provide a burn-in method and device capable of accelerating burn-in also in a peripheral circuit portion and a logic circuit portion as well as a memory cell array portion. A high temperature stress is applied to a wafer to be an evaluation object (Step SP11). Next, a low temperature stress and an electric stress are applied to the wafer (Step SP12). Then, it is decided whether a predetermined stress is applied to the wafer or not (Step SP13). If a result of the decision at the Step SP13 is "YES", it is decided whether a defective portion is generated in each chip of the wafer or not (Step SP14). Referring to a chip decided to have a failure generated thereon as a result of the decision at the Step SP14, it is decided whether repair is executed for the defective portion or not (Step SP15). If a result of the decision at the Step SP15 is "YES", the repair is executed for the defective portion (Step SP16).

6 Claims, 11 Drawing Sheets

F I G . 1 2
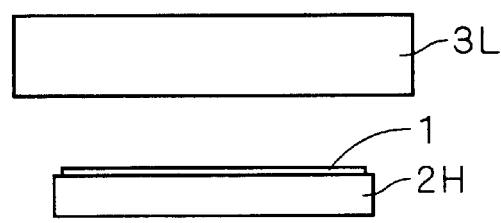
F I G . 1 3
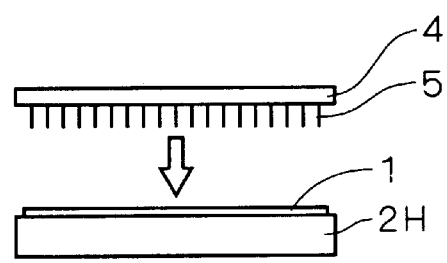
F I G . 1 4
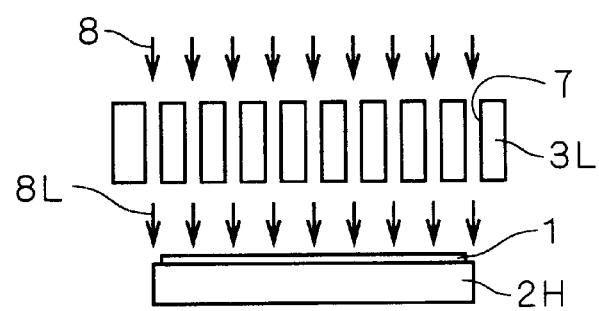

BURN-IN METHOD AND BURN-IN DEVICE

BACKGROUND OF THE INVENTION

1. Field of the Invention

The present invention relates to a burn-in method and device for carrying out a reliability test of a semiconductor device, and more particularly to a wafer level burn-in method and device for carrying out a test in a state of a wafer.

2. Description of the Background Art

A burn-in test of the semiconductor device is an acceleration test for applying, to the semiconductor device, a higher voltage stress or a higher temperature stress than that in the case in which the semiconductor device is actually used as a product and for evaluating an electrical characteristic of the semiconductor device after the application of the stress, thereby screening the semiconductor device generating initial failures or the semiconductor device having the characteristic keeping away from a normal distribution.

Conventionally, a wafer test has been carried out, a non-defective chip passing the wafer test has been assembled and the burn-in test of the semiconductor device has been executed in a package condition in which the assembly is sealed with a package (a package such as a resin, ceramic or plastics). More specifically, a large number of packaged semiconductor devices are provided on a burn-in board and a burn-in stress is collectively applied in a thermostat. Thus, the electrical characteristic of each semiconductor device is evaluated after the application of the stress.

FIG. 19 is a flow chart for explaining a conventional burn-in method. First of all, a high temperature stress and an electric stress are applied to a wafer to be an evaluation object (Step SP101). More specifically, the electric stress is applied in a state in which the wafer is put in a high temperature furnace or the electric stress is externally applied in a state in which the wafer is mounted on a high temperature chuck.

Next, it is decided whether a predetermined stress is applied to the wafer or not (Step SP102). At the Step SP102, if it is decided that the predetermined stress is not applied to the wafer, the processing returns to the Step SP101 where the high temperature stress and the electric stress are applied again.

On the other hand, if it is decided that the predetermined stress is applied to the wafer at the Step SP102, it is decided whether a defective portion is generated in each chip of the wafer or not (PASS/FAIL decision) (Step SP103). Furthermore, if a failure is generated, the defective portion is identified.

As a result of the PASS/FAIL decision at the Step SP103, it is decided whether a defective portion is to be repaired or not for a chip which is decided to have a failure generated thereon (Step SP104). If a result of the decision at the Step SP104 is "YES", the defective portion is repaired (Step SP105).

A chip decided as "PASS" at the Step SP103 and a chip repaired at the Step SP105 are subjected to an assembling step and a packaging step and are then shipped as products. On the other hand, a chip decided as "NO" at the Step SP104 (that is, a chip which generates a failure and cannot be repaired) is not subjected to the assembling step and the like and is treated as a defective chip.

FIG. 20 is a top view typically showing a structure of a semiconductor memory to be an evaluation object of burn-in. A chip 101 has a plurality of memory cell array portions 102, a peripheral circuit portion 103 and a logic circuit portion 104. Each memory cell array portion 102 is provided with a plurality of memory cells arranged in a matrix, a plurality of word lines for each row of the memory cell array and a plurality of bit lines for each column of the memory cell array. A peripheral circuit such as a sense amplifier is formed in the peripheral circuit portion 103 together with a plurality of wirings. A random logic circuit is formed in the logic circuit portion 104 together with a plurality of wirings.

As a method of efficiently carrying out the burn-in by using the semiconductor memory as an object, there have been proposed a method of selecting all bit lines and all word lines at the same time and collectively applying an electrical stress to all memory cells (Japanese Patent Application Laid-Open No. 5-144910 (1993)) and a method of selecting all bit lines and half of word lines at the same time and collectively applying an electrical stress to memory cells (half of all the memory cells) connected to the word lines (Japanese Patent Application Laid-Open No. 4-756 (1992)). In such a method, a selectivity of the word line in the memory cell array portion 102 is more enhanced than that in an actual usage state. As compared with the case in which the word lines are selected one by one to carry out the burn-in as in the actual usage state, a time required for the burn-in can be shortened. In other words, the burn-in can be accelerated.

Referring to the wiring of the peripheral circuit portion 103 and the wiring of the logic circuit portion 104, however, there is a portion where all the wirings cannot be collectively selected electrically in respect of a structure. In the conventional burn-in method, therefore, there has been a problem in that it is hard to accelerate the burn-in in the peripheral circuit portion 103 and the logic circuit portion 104. In the conventional burn-in method in which only a high temperature stress and an electric stress are applied, particularly, a large number of test patterns of the electric stress are required for applying the electric stress to whole wirings of the logic circuit portion 104. Therefore, there has been a problem in that the burn-in cannot be accelerated in fact.

SUMMARY OF THE INVENTION

A first aspect of the present invention is directed to a burn-in method comprising the steps of (a) applying one of a high temperature stress and a low temperature stress to an evaluation object, (b) applying an electric stress and the other of the high temperature stress and the low temperature stress to the evaluation object, and (c) deciding whether a failure is generated on the evaluation object or not after the steps (a) and (b).

A second aspect of the present invention is directed to the burn-in method according to the first aspect, wherein the steps (a) and (b) are executed repetitively.

A third aspect of the present invention is directed to a burn-in device comprising one of a high temperature generating portion and a low temperature generating portion which has mounting surface where an evaluation object is to be mounted, the other of the high temperature generating portion and the low temperature generating portion which is provided opposite to the mounting surface of the one of the high temperature generating portion and the low temperature generating portion and can be moved relatively to the one of the high temperature generating portion and the low temperature generating portion, an electric stress applying portion for applying an electric stress to the evaluation object, and an evaluating portion for deciding whether a failure is generated on the evaluation object or not.

A fourth aspect of the present invention is directed to the burn-in device according to the third aspect, wherein the other of the high temperature generating portion and the low temperature generating portion is provided with a plurality of through holes penetrating from one main surface opposed to the mounting surface to the other main surface.

A fifth aspect of the present invention is directed to the burn-in device according to the third aspect, wherein the other of the high temperature generating portion and the low temperature generating portion partially applies a temperature stress to the evaluation object.

A sixth aspect of the present invention is directed to the burn-in device according to any one of the third to fifth aspects, further comprising a driving mechanism for driving at least one of the high temperature generating portion and the low temperature generating portion, and a control portion for controlling the driving mechanism.

A seventh aspect of the present invention is directed to the burn-in device according to the sixth aspect, further comprising a temperature sensor connected to the control portion and provided close to the evaluation object.

An eighth aspect of the present invention is directed to the burn-in device according to the sixth or seventh aspect, wherein the electric stress applying portion is connected to the control portion.

According to the first aspect of the present invention, the high temperature stress and the low temperature stress are applied consecutively. Consequently, the generation of failures caused by a thermal stress can be accelerated efficiently.

According to the second aspect of the present invention, the high temperature stress and the low temperature stress are applied repetitively. Consequently, a great burn-in stress can be applied to the evaluation object.

According to the third aspect of the present invention, the high temperature stress and the low temperature stress are applied from the high temperature generating portion and the low temperature generating portion to the evaluation object, respectively. Consequently, the generation of failures caused by the thermal stress can be accelerated efficiently.

According to the fourth aspect of the present invention, the gas is blown against the other main surface of the other of the high temperature generating portion and the low temperature generating portion. Consequently, a gas having a high temperature or a low temperature which is heated or cooled when passing through a through hole can be blown against the evaluation object.

According to the fifth aspect of the present invention, the high temperature portion obtained by the application of the high temperature stress from the high temperature generating portion and the low temperature portion obtained by the application of the low temperature stress from the low temperature generating portion can be fabricated in the evaluation object. Consequently, the generation of failures can be accelerated by utilizing a bias of a stress caused by a temperature gradient in the evaluation object or the like.

According to the sixth aspect of the present invention, the moving speed and stop position of at least one of the high temperature generating portion and the low temperature generating portion can be controlled by the control portion and the driving mechanism. Therefore, it is possible to accurately control the temperature stress to be applied to the evaluation object.

According to the seventh aspect of the present invention, the control portion can control each temperature of the high temperature generating portion and the low temperature generating portion based on temperature data transferred from the temperature sensor. Therefore, the temperature stress to be applied to the evaluation object can be controlled to have a desirable value.

According to the eighth aspect of the present invention, all the application of the high temperature stress through the high temperature generating portion, the application of the low temperature stress through the low temperature generating portion and the application of the electric stress through the electric stress applying portion are controlled by the control portion. Therefore, it is possible to enhance controllability as a system of a whole burn-in device.

In order to solve the above-mentioned problems, it is an object of the present invention to provide a burn-in method and a burn-in device which can accelerate burn-in in a peripheral circuit portion and a logic circuit portion as well as a memory cell array portion.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 12 and 13 are side views typically showing a part of a structure of a burn-in device according to a ninth embodiment of the present invention, FIG. 14 is a sectional view typically showing a part of a structure of a burn-in device according to a tenth embodiment of the present invention, FIG. 20 is a top view typically showing a structure of a semiconductor memory to be an evaluation object of burn-in.

DESCRIPTION OF THE PREFERRED EMBODIMENTS

First Embodiment

Figure 1:
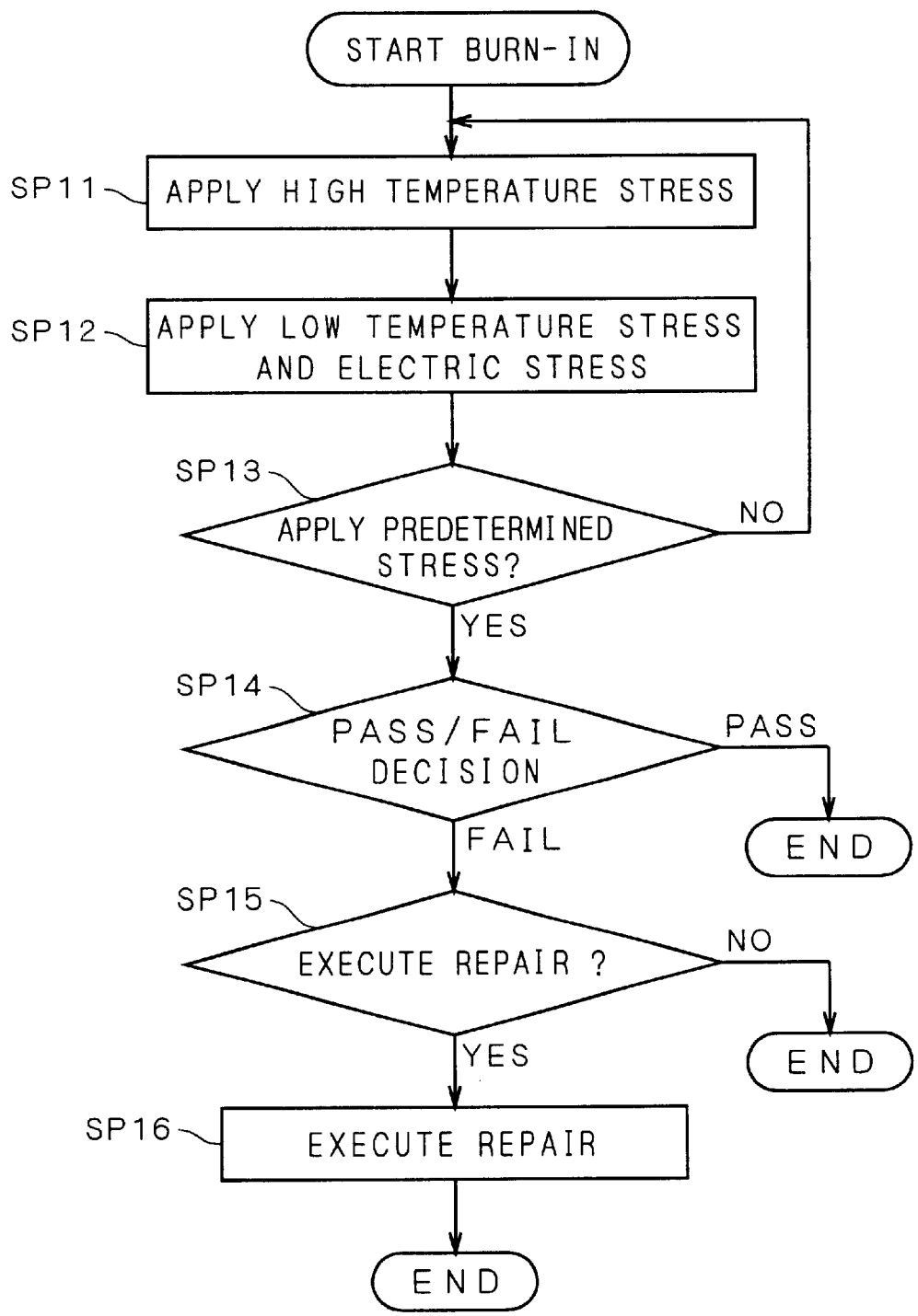
FIG. 1 is a flow chart for explaining a burn-in method according to a first embodiment of the present invention.

FIG. 1 is a flow chart for explaining a bum-in method according to a first embodiment of the present invention. First of all, a predetermined high temperature stress is applied to a wafer to be an evaluation object (Step SP11). For example, the wafer is put in a high temperature furnace set to have a predetermined temperature for a predetermined time or the wafer is mounted on a high temperature chuck set to have a predetermined temperature for a predetermined time.

Next, a predetermined low temperature stress and a predetermined electric stress are applied to the wafer having the high temperature stress applied thereto (Step SP12). For example, the electric stress is applied in a state in which the wafer is put in a low temperature furnace set to have a predetermined temperature or the electric stress is applied in a state in which the wafer is mounted on a low temperature chuck set to have a predetermined temperature. The application of the electric stress is carried out by using a well-known probe card having a plurality of probe needles.

Next, it is decided whether a predetermined stress is applied to the wafer or not (Step SP13). For example, a step of a test is preset to a burn-in device and it is decided whether the application of the predetermined stress is completed or not depending on whether the number of applications of the stress or a time required for the application reaches a set value or not. At the Step SP13, if it is decided that the number of applications of the stress or the time required for the application does not reach the set value, the processing returns to the Steps SP11 and SP12 where the temperature stress and the electric stress are applied again.

On the other hand, if it is decided that the predetermined stress is applied at the Step SP13, it is decided whether a defective portion is generated in each chip of the wafer or not (PASS/FAIL decision) (Step SP14). The PASS/FAIL decision is executed in an evaluating portion provided in the burn-in device. More specifically, a current is externally applied to a circuit fabricated in the chip and a value of the current flowing in the circuit is measured to decide the generation of failures. Furthermore, if a failure is generated, the defective portion is identified. Alternatively, address data are externally input to the circuit and the generation of failures is decided based on a result of an output. Furthermore, if a failure is generated, the defective portion is identified.

Referring to a chip decided to have the failure generated thereon as a result of the PASS/FAIL decision at the Step SP14, it is decided whether the defective portion is to be repaired or not (Step SP15). The "repair" implies that a circuit having failures generated due to a disconnection or the like is replaced with another equivalent circuit which is prepared in advance. In the case in which a failure is generated on a portion in which a circuit for replacement is not prepared or the case in which circuits for replacement are prepared but a large number of chips generate the same defective portions so that the circuits for replacement are used up, the same portion cannot be repaired and it is decided that the repair is not executed.

Whether the repair can be carried out is decided as follows. Data indicative of a relationship between a defective portion and the number of circuits for replacement are previously taught to a burn-in device. The device automatically decides repair able/disable in relation to each defective portion by referring to the data. Based on information about the defective portion, an operator may decide the repair able/disable. If a result of the decision at the Step SP15 is "YES", the defective portion is repaired (Step SP16).

A chip decided as "PASS" at the Step SP14 and a chip repaired at the Step SP16 are subjected to an assembling step and a packaging step and are shipped as products. On the other hand, a chip decided as "NO" at the Step SP15 (that is, a chip which has a failure generated thereon and cannot be repaired) is not subjected to the assembling step and the like and is treated as a defective chip.

According to the burn-in method in accordance with the first embodiment, thus, a high temperature stress is applied and a low temperature stress and an electric stress are then applied to carry out the burn-in differently from the conventional burn-in method of applying only the high temperature stress and the electric stress. By continuously applying the high temperature stress and the low temperature stress, the generation of failures caused by a thermal stress can be accelerated efficiently. In addition, the thermal stress is increased when the low temperature stress is applied. Therefore, when the electric stress is further applied in a low temperature state in which a great internal stress is generated, the generation of failures caused by the internal stress can further be accelerated. As a result, a screening efficiency can be enhanced.

Moreover, a high temperature stress and a low temperature stress which are used as a burn-in stress are also applied uniformly to a region in a chip which is hard to uniformly apply the electric stress (for example, a peripheral circuit portion and a logic circuit portion). Consequently, uniformity of the applied stress can be enhanced. Thus, the burn-in having a high reliability can be carried out for a wide range as an object at a time.

Furthermore, a defective portion which can be repaired is subjected to the repair and is then subjected to assembly and packaging. Thus, a non-defective device can be shipped. Consequently, it is possible to increase the number of chips per wafer which are obtained as non-defective devices, resulting in an enhancement in yield

Second Embodiment

In a second embodiment, there will be proposed a burn-in device capable of efficiently executing application of a temperature cycle stress in relation to the burn-in method according to the first embodiment.

Figure 2:
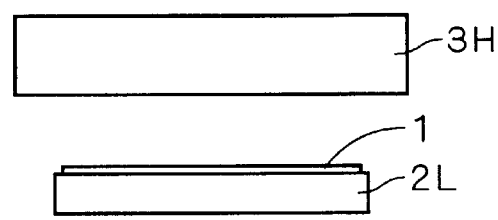
FIGS. 2 and 3 are side views typically showing a part of a structure of a burn-in device according to a second embodiment of the present invention.
Figure 3:
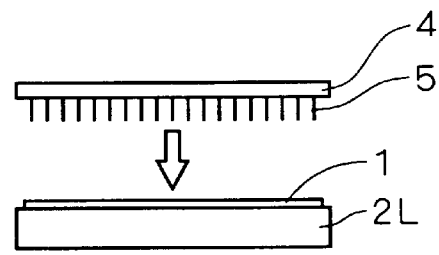

FIGS. 2 and 3 are side views typically showing a part of a structure of the burn-in device according to the second embodiment of the present invention. A wafer 1 to be an evaluation object is mounted on a wafer mounting surface of a low temperature generating portion (for example, a disc-shaped low temperature chuck 2L) for generating a predetermined low temperature. The low temperature chuck 2L cools the wafer 1 down to a predetermined temperature through liquid nitrogen introduced to the inside or a Peltier element provided on the inside. Moreover, a high temperature generating portion (for example, a disc-shaped high temperature member 3H) for generating a predetermined high temperature is opposed close to the low temperature chuck 2L. The high temperature member 3H serves to generate a predetermined high temperature by means of a heater provided on the inside. In place of the high temperature member 3H, a heating lamp may be provided. When at least one of the low temperature chuck 2L and the high temperature member 3H is driven in a vertical or transverse direction, they are relatively movable.

When the high temperature stress is to be applied to the wafer 1 at the Step SP11 in the burn-in method according to the first embodiment, the low temperature chuck 2L and the high temperature member 3H are caused to approach to each other as shown in FIG. 2. Consequently, the application of the low temperature stress from the low temperature chuck 2L is offset and the high temperature stress is applied to the wafer 1 by radiation heat sent from the high temperature member 3H.

When the low temperature stress and the electric stress are to be applied to the wafer 1 at the Step SP12 in the burn-in method according to the first embodiment, the low temperature chuck 2L and the high temperature member 3H are caused to keep away from each other, thereby applying the low temperature stress to the wafer 1 through the low temperature chuck 2L. As shown in FIG. 3, furthermore, a plurality of probe needles 5 of a probe card 4 are caused to abut on the wafer 1, thereby applying the electric stress from the probe card 4 to the wafer 1.

If the result of the decision at the Step SP13 in the burn-in method according to the first embodiment is "NO", it is preferable that the above-mentioned operation should be executed repetitively in order to repetitively apply the high temperature stress and the low temperature stress to the wafer 1.

According to the burn-in device in accordance with the second embodiment, thus, the wafer 1 is mounted on the low temperature chuck 2L, and the low temperature chuck 2L and the high temperature member 3H are caused to approach to each other or to keep away from each other. Thus, control is carried out to apply the high temperature stress or the low temperature stress to the wafer 1. Accordingly, when the low temperature stress is to be applied after the high temperature stress is applied to the wafer 1, it is not necessary to mount the wafer 1 on the low temperature chuck in place of the high temperature chuck or it is not necessary to deliver the wafer 1 from a high temperature furnace to a low temperature furnace. Therefore, a time required for the burn-in can be shortened.

Third Embodiment

Figure 4:
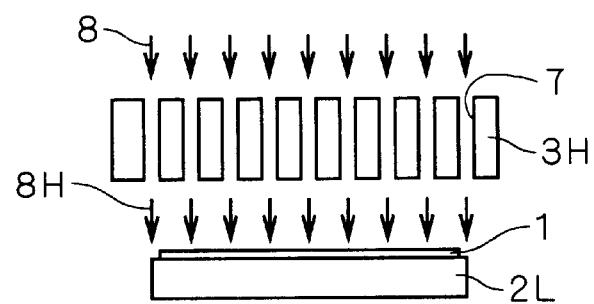
FIG. 4 is a sectional view typically showing a part of a structure of a burn-in device according to a third embodiment of the present invention.

FIG. 4 is a sectional view typically showing a part of a structure of a burn-in device according to a third embodiment of the present invention. A high temperature member 3H according to the third embodiment is constituted by the high temperature member 3H according to the second embodiment shown in FIG. 2 and is provided with a plurality of through holes 7. The through holes 7 are discretely formed to penetrate from a top surface of the high temperature member 3H to a bottom surface thereof (a main surface on the side opposite to a wafer 1).

When a high temperature stress is to be applied to the wafer 1 at the Step SP11 in the burn-in method according to the first embodiment, a low temperature chuck 2L and the high temperature member 3H are caused to approach to each other and a gas 8 such as nitrogen or dry air is blown against a top surface of the high temperature member 3H as shown in FIG. 4. The gas 8 is heated by the high temperature member 3H when passing through the through hole 7 and is thereby changed into a high temperature gas 8H to be blown against the wafer 1.

According to the burn-in device in accordance with the third embodiment, thus, a high temperature stress can be applied to the wafer 1 through radiation heat sent from the high temperature member 3H and the blowing of the high temperature gas 8H. By regulating a flow rate of the gas 8, accordingly, the high temperature stress to be applied to the wafer 1 can be controlled.

Fourth Embodiment

Figure 5:
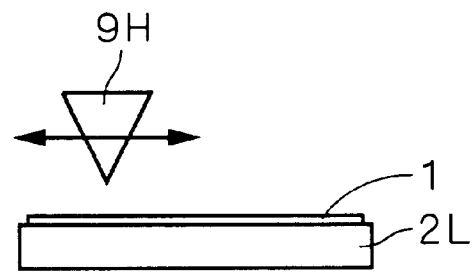
FIG. 5 is a side view typically showing a part of a structure of a burn-in device according to a fourth embodiment of the present invention.

FIG. 5 is a side view typically showing a part of a structure of a burn-in device according to a fourth embodiment of the present invention. In place of the disc-shaped high temperature member 3H shown in FIG. 2, a triangle pole-shaped high temperature member 9H having a sharp side opposed to a low temperature chuck 2L is provided. The high temperature member 9H serves to generate a predetermined high temperature by means of a heater provided on the inside in the same manner as the high temperature member 3H. When at least one of the high temperature member 9H and the low temperature chuck 2L is driven in a vertical or transverse direction, they are relatively movable.

When a high temperature stress is to be applied to a wafer 1 at the step SP11 in the burn-in method according to the first embodiment, the high temperature member 9H is swept in the transverse direction with the low temperature chuck 2L and the high temperature member 9H approaching to each other as shown in FIG. 5.

According to the burn-in device in accordance with the fourth embodiment, thus, the whole surface of the wafer 1 is not uniformly set to have a high temperature through the disc-shaped high temperature member 3H but a part of the wafer 1 is locally set to have a high temperature through the triangle pole-shaped high temperature member 9H. Accordingly, a high temperature portion obtained by application of a high temperature stress from the high temperature member 9H and a low temperature portion obtained by application of a low temperature stress from the low temperature chuck 2L can be fabricated in a wafer surface. Consequently, generation of failures can be accelerated by utilizing a bias of a stress and a movement phenomenon of an aluminum atom in a wiring or the like which are caused by a temperature gradient in the wafer surface. Thus, screening can be carried out efficiently.

Fifth Embodiment

Figure 6:
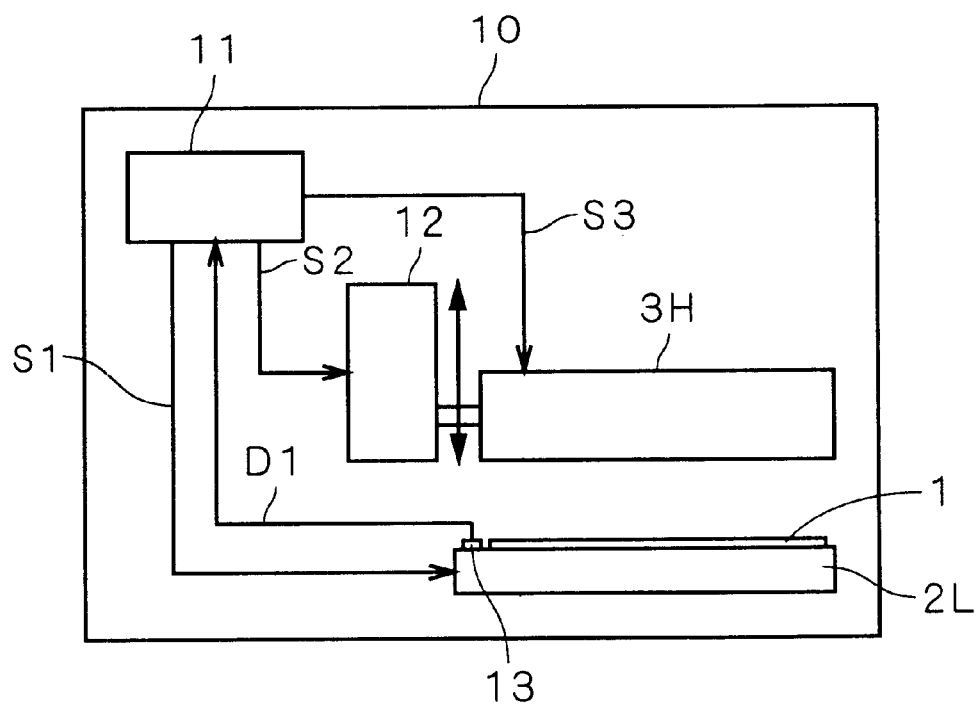
FIG. 6 is a block diagram typically showing a part of a structure of a burn-in device according to a fifth embodiment of the present invention.

FIG. 6 is a block diagram typically showing a part of a structure of a burn-in device according to a fifth embodiment of the present invention. A burn-in device 10 comprises a low temperature chuck 2L and a high temperature member 3H in the same manner as that in the second embodiment. In the fifth embodiment, the low temperature chuck 2L is fixed. Moreover, the burn-in device 10 comprises a driving mechanism 12 for driving the high temperature member 3H in a vertical direction (and a transverse direction if necessary) and a controller 11 connected to the driving mechanism 12.

When a high temperature stress is to be applied to a wafer 1 at the Step SP11 in the burn-in method according to the first embodiment, the driving mechanism 12 drives the high temperature member 3H downward based on a control signal S2 sent from the controller 11. The control signal S2 serves to control a moving speed of the high temperature member 3H and a stop position of the high temperature member 3H. Consequently, the low temperature chuck 2L and the high temperature member 3H approach to each other as shown in FIG. 6 so that a high temperature stress is applied to the wafer 1.

Moreover, when the Step SP12 in the burn-in method according to the first embodiment is to be executed, the driving mechanism 12 drives the high temperature member 3H upward based on the control signal S2 sent from the controller 11. Consequently, the low temperature chuck 2L and the high temperature member 3H keep away from each other so that a low temperature stress is applied to the wafer 1. In addition, an electric stress is externally applied to the wafer 1.

As shown in FIG. 6, a temperature sensor 13 may further be provided on the low temperature chuck 2L close to the wafer 1, and the temperature sensor 13, the low temperature chuck 2L and the high temperature member 3H may be connected to the controller 11. The controller 11 receives temperature data D1 from the temperature sensor 13 and inputs control signals SI and S2 to the low temperature chuck 2L and the high temperature member 3H, respectively. Consequently, temperatures of the low temperature chuck 2L and the high temperature member 3H are controlled, respectively.

While the description has been given to the example in which the burn-in device 10 according to the fifth embodiment is constituted based on the burn-in device according to the second embodiment, the burn-in device 10 according to the fifth embodiment can also be constituted based on the burn-in devices according to the third and fourth embodiments.

According to the burn-in device 10 in accordance with the fifth embodiment, thus, the moving speed and stop position of the high temperature member 3H are controlled by the controller 11 and the driving mechanism 12. Therefore, the high temperature stress to be applied to the wafer 1 by the high temperature member 3H can be controlled accurately.

Moreover, each temperature of the low-temperature chuck 2L and the high temperature member 3H is controlled by the controller 11 based on the temperature data D1 transmitted from the temperature sensor 13. Therefore, the low temperature stress and the high temperature stress which are to be applied to the wafer 1 can be controlled to have desirable values.

Sixth Embodiment

Figure 7:
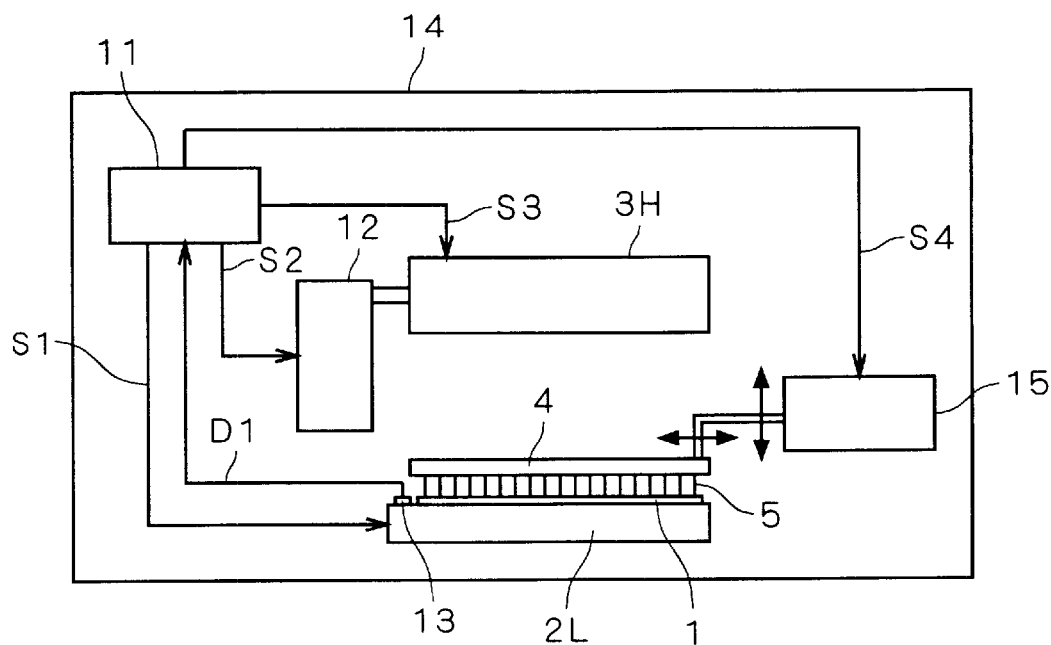
FIG. 7 is a block diagram typically showing a part of a structure of a burn-in device according to a sixth embodiment of the present invention.

FIG. 7 is a block diagram typically showing a part of a structure of a burn-in device according to a sixth embodiment of the present invention. A burn-in device 14 further comprises an electric stress applying portion to be controlled by a controller 11 based on the burn-in device 10 according to the fifth embodiment. The electric stress applying portion includes a probe card 4 having a plurality of probe needles 5 and a driving mechanism 15 for driving the probe card 4 in vertical and transverse directions. The driving mechanism 15 is connected to the controller 11.

When the Step SP12 in the burn-in method according to the first embodiment is to be executed, the driving mechanism 12 drives a high temperature member 3H upward based on a control signal S2 sent from the controller 11 so that a low temperature stress is applied to a wafer 1 through a low temperature chuck 2L. In addition, the driving mechanism 15 drives the probe card 4 such that the probe needle 5 abuts on the wafer 1 based on a control signal S4 sent from the controller 11. Consequently, an electric stress is applied to the wafer 1 by the probe card 4. The control signal S4 serves to control a stop position of the probe card 4 and to give the probe card 4 an instruction for applying the electric stress and a test pattern obtained at that time. The control signal S4 is input to the probe card 4 through the driving mechanism 15.

According to the burn-in device 14 in accordance with the sixth embodiment, thus, the driving operation of the electric stress applying portion for applying the electric stress to the wafer 1 is also controlled by the controller 11. Therefore, it is possible to enhance controllability as a system of the whole burn-in device.

Seventh Embodiment

Figure 8:
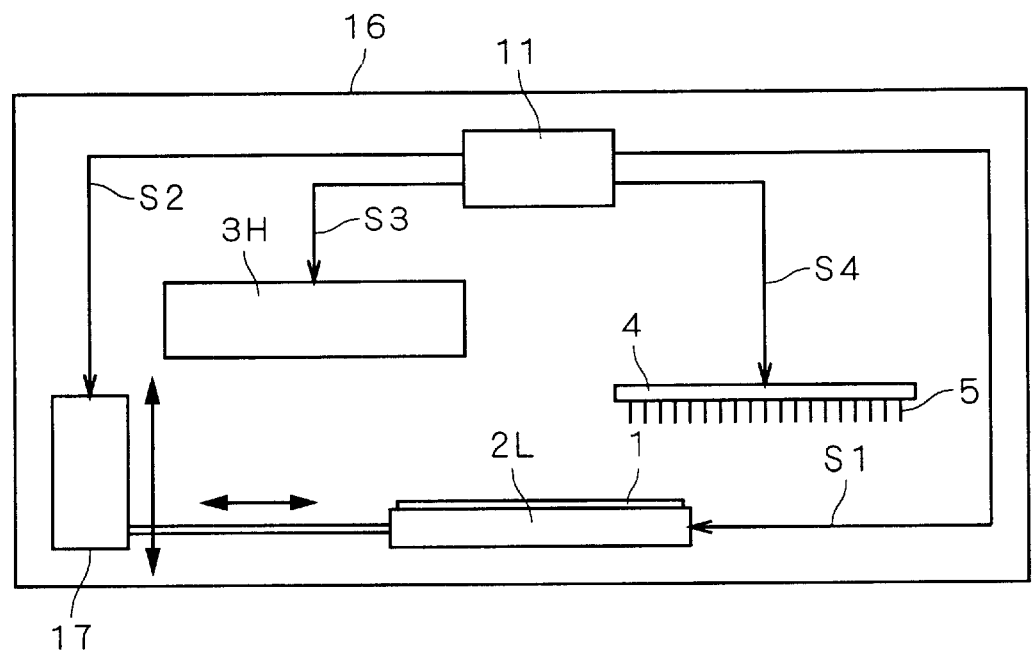
FIGS. 8 to 10 are block diagrams typically showing a part of a structure of a burn-in device according to a seventh embodiment of the present invention.
Figure 9:
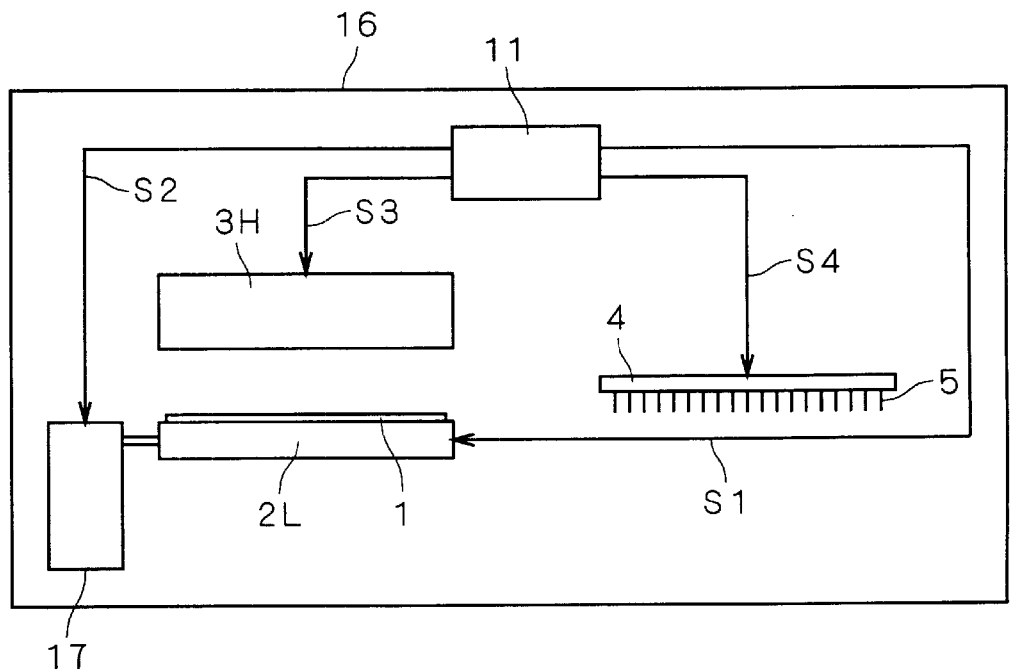
Figure 10:
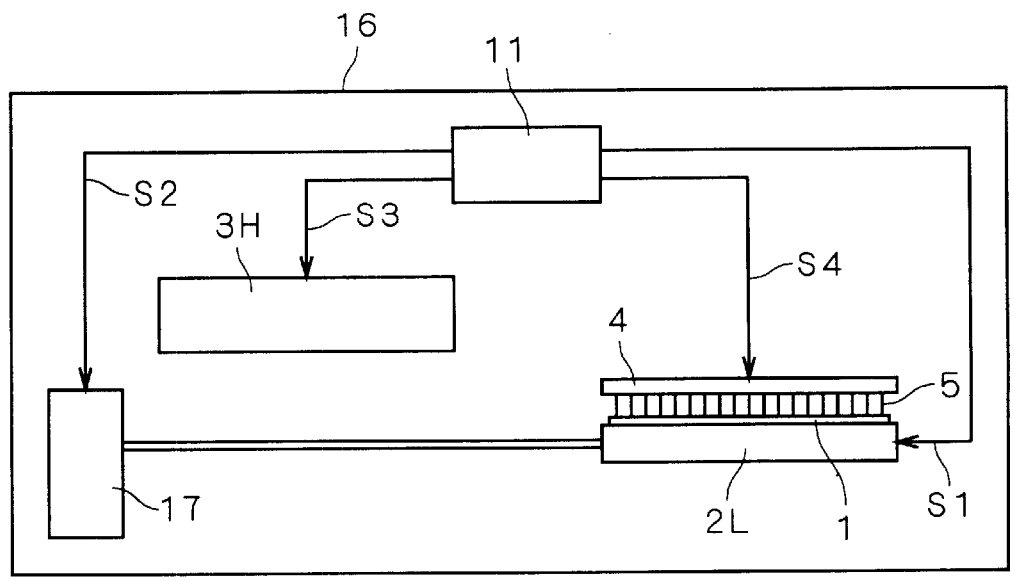

FIGS. 8 to 10 are block diagrams typically showing a part of a structure of a burn-in device according to a seventh embodiment of the present invention. For simplicity of the drawings, the temperature sensor 13 shown in FIG. 6 is omitted. A burn-in device 16 comprises a low temperature chuck 2L and a high temperature member 3H in the same manner as that in the second embodiment. In the seventh embodiment, the high temperature member 3H is fixed. Moreover, the burn-in device 16 comprises a driving mechanism 17 for driving the low temperature chuck 2L in vertical and transverse directions. Furthermore, the burn-in device 16 comprises an electric stress applying portion having a probe card 4 fixed thereto. The driving mechanism 17 and the probe card 4 are connected to a controller 11. In the same manner as in the fifth embodiment, the temperature sensor 13 (not shown), the low temperature chuck 2L and the high temperature member 3H are connected to the controller 11.

Referring to FIG. 9, when a high temperature stress is to be applied to a wafer 1 at the Step SP11 in the burn-in method according to the first embodiment, the driving mechanism 17 drives the low temperature chuck 2L to approach to the high temperature member 3H based on a control signal S2 sent from the controller 11. The control signal S2 serves to control a moving speed of the low temperature chuck 2L and a stop position of the low temperature chuck 2L. Consequently, the low temperature chuck 2L and the high temperature member 3H approach to each other so that the high temperature stress is applied to the wafer 1.

Referring to FIG. 10, when a low temperature stress and an electric stress are to be applied to the wafer 1 at the Step SP12 in the burn-in method according to the first embodiment, the driving mechanism 17 drives the low temperature chuck 2L such that the wafer 1 abuts on a probe needle 5 based on the control signal S2 sent from the controller 11. Consequently, the low temperature stress is applied to the wafer 1 by the low temperature chuck 2L and the electric stress is applied to the wafer 1 by the probe card 4 based on a control signal S4 sent from the controller 11. The control signal S4 serves to give the probe card 4 an instruction for applying the electric stress and a test pattern obtained at that time.

While the description has been given to the example in which the burn-in device 16 according to the seventh embodiment is constituted based on the burn-in device according to the second embodiment, the burn-in device 16 according to the seventh embodiment can also be constituted based on the burn-in devices according to the third and fourth embodiments.

According to the burn-in device 16 in accordance with the seventh embodiment, thus, the application of the high temperature stress through the high temperature member 3H, the application of the low temperature stress through the low temperature chuck 2L and the application of the electric stress through the probe card 4 are controlled by the controller 11. Therefore, it is possible to enhance controllability as a system of the whole burn-in device.

Eighth Embodiment

Figure 11:
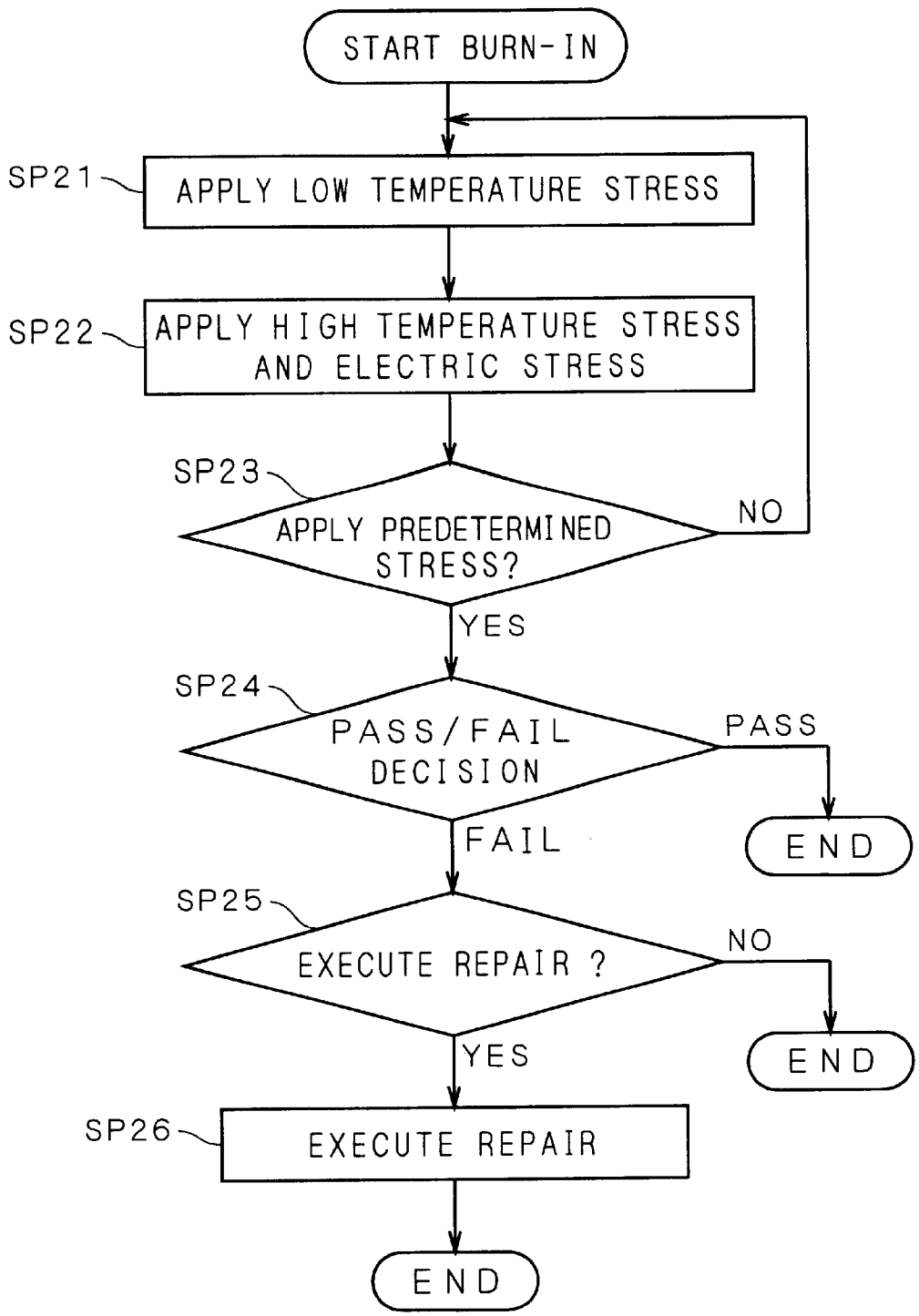
FIG. 11 is a flow chart for explaining a burn-in method according to an eighth embodiment of the present invention.

FIG. 11 is a flow chart for explaining a burn-in method according to an eighth embodiment of the present invention.

First of all, a predetermined low temperature stress is applied to a wafer to be an evaluation object (Step SP21). For example, the wafer is put in a low temperature furnace set to have a predetermined temperature for a predetermined time or the wafer is mounted on a low temperature chuck set to have a predetermined temperature for a predetermined time.

Next, a predetermined high temperature stress and a predetermined electric stress are applied to the wafer having the low temperature stress applied thereto (Step SP22). For example, the electric stress is applied in a state in which the wafer is put in a high temperature furnace set to have a predetermined temperature or the electric stress is applied in a state in which the wafer is mounted on a high temperature chuck set to have a predetermined temperature.

Next, it is decided whether a predetermined stress is applied to the wafer or not (Step SP23). If a result of the decision is "NO" at the Step SP23, the processing returns to the Steps SP21 and SP22 where the application of the temperature stress and the electric stress is executed again. On the other hand, if the result of the decision is "YES" at the Step SP23, a PASS/FAIL decision is carried out (Step SP24). Subsequently, it is decided whether repair is to be executed or not (Step SP25) and the repair is properly executed (Step SP26) in the same manner as in the first embodiment.

According to the burn-in method in accordance with the eighth embodiment, thus, a low temperature stress is applied and a high temperature stress and an electric stress are then applied to carry out the burn-in differently from the conventional burn-in method of applying only the high temperature stress and the electric stress. By continuously applying the low temperature stress and the high temperature stress, the generation of failures caused by a thermal stress can be accelerated efficiently. In addition, the generation of failures of the device is accelerated more easily when the high temperature stress is applied. Therefore, when the electric stress is further applied in a high temperature state, the generation of failures caused by the thermal stress can further be accelerated. As a result, a screening efficiency can be enhanced.

In the same manner as the burn-in method according to the first embodiment, moreover, the uniformity of the burn-in stress can be enhanced through the application of the temperature stress. In addition, the execution of repair can also contribute to an enhancement in yield.

Ninth Embodiment

In a ninth embodiment, there will be proposed a burn-in device capable of efficiently executing application of a temperature cycle stress in relation to the burn-in method according to the eighth embodiment.

FIGS. 12 and 13 are side views typically showing a part of a structure of the burn-in device according to the ninth embodiment of the present invention. A wafer 1 is mounted on a wafer mounting surface of a high temperature generating portion (for example, a disc-shaped high temperature chuck 2H). The high temperature chuck 2H serves to heat the wafer 1 to a predetermined temperature by means of a heater provided on the inside. Moreover, a low temperature generating portion (for example, a disc-shaped low temperature member 3L) is opposed close to the high temperature chuck 2H. The low temperature member 3L serves to generate a predetermined low temperature through liquid nitrogen introduced to the inside or a Peltier element provided on the inside. When at least one of the high temperature chuck 2H and the low temperature member 3L is driven in a vertical or transverse direction, they are relatively movable.

When the low temperature stress is to be applied to the wafer 1 at the Step SP21 in the burn-in method according to the eighth embodiment, the high temperature chuck 2H and the low temperature member 3L are caused to approach to each other as shown in FIG. 12. Consequently, the application of the high temperature stress from the high temperature chuck 2H is offset so that the low temperature stress is applied to the wafer 1.

When the high temperature stress and the electric stress are to be applied to the wafer 1 at the Step SP22 in the burn-in method according to the eighth embodiment, the high temperature chuck 2H and the low temperature member 3L are caused to keep away from each other, thereby applying the high temperature stress to the wafer 1 through the high temperature chuck 2H. As shown in FIG. 13, furthermore, a plurality of probe needles 5 of a probe card 4 are caused to abut on the wafer 1, thereby applying the electric stress from the probe card 4 to the wafer 1.

According to the burn-in device in accordance with the ninth embodiment, thus, the wafer 1 is mounted on the high temperature chuck 2H, and the high temperature chuck 2H and the low temperature member 3L are caused to approach to each other or to keep away from each other. Consequently, control is carried out to apply the low temperature stress or the high temperature stress to the wafer 1. Accordingly, when the high temperature stress is to be applied after the low temperature stress is applied to the wafer 1, it is not necessary to mount the wafer 1 on the high temperature chuck in place of the low temperature chuck or it is not necessary to deliver the wafer 1 from a low temperature furnace to a high temperature furnace. Therefore, a time required for the burn-in can be shortened.

Tenth Embodiment

FIG. 14 is a sectional view typically showing a part of a structure of a burn-in device according to a tenth embodiment of the present invention. A low temperature member 3L according to the tenth embodiment is constituted by the low temperature member 3L according to the ninth embodiment shown in FIG. 12 and is discretely provided with a plurality of through holes 7.

When a low temperature stress is to be applied to a wafer 1 at the Step SP21 in the burn-in method according to the eighth embodiment, a high temperature chuck 2H and the low temperature member 3L are caused to approach to each other and a gas 8 such as nitrogen or dry air is blown against a top surface of the low temperature member 3L as shown in FIG. 14. The gas 8 is cooled by the low temperature member 3L when passing through the through hole 7 and is thereby changed into a low temperature gas 8L to be blown against the wafer 1.

According to the burn-in device in accordance with the tenth embodiment, thus, a low temperature stress can be applied to the wafer 1 by the low temperature member 3L and the low temperature gas 8L. By regulating a flow rate of the gas 8, accordingly, the low temperature stress to be applied to the wafer 1 can be controlled.

Eleventh Embodiment

Figure 15:
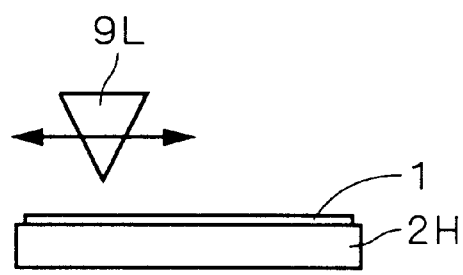
FIG. 15 is a side view typically showing a part of a structure of a burn-in device according to an eleventh embodiment of the present invention.

FIG. 15 is a side view typically showing a part of a structure of a burn-in device according to an eleventh embodiment of the present invention. In place of the disc-shaped low temperature member 3L shown in FIG. 12, a triangle pole-shaped low temperature member 9L having a sharp side opposed to a high temperature chuck 2H is provided. The low temperature member 9L serves to generate a predetermined low temperature through liquid nitrogen introduced to the inside or a Peltier element provided on the inside in the same manner as the low temperature member 3L. When at least one of the low temperature member 9L and the high temperature chuck 2H is driven in a vertical or transverse direction, they are relatively movable.

When a low temperature stress is to be applied to a wafer 1 at the Step SP21 in the burn-in method according to the eighth embodiment, the low temperature member 9L is swept in the transverse direction with the high temperature chuck 2H and the low temperature member 9L approaching to each other as shown in FIG. 15.

According to the burn-in device in accordance with the eleventh embodiment, thus, the whole surface of the wafer 1 is not uniformly set to have a low temperature through the disc-shaped low temperature member 3L but a part of the wafer 1 is locally set to have a low temperature through the triangle pole-shaped low temperature member 9L. Accordingly, a low temperature portion obtained by application of a low temperature stress from the low temperature member 9L and a high temperature portion obtained by application of a high temperature stress from the high temperature chuck 2H can be fabricated in a wafer surface. Consequently, generation of failures can be accelerated by utilizing a bias of a stress and a movement phenomenon of an aluminum atom in a wiring or the like which are caused by a temperature gradient in the wafer surface. Thus, screening can be carried out efficiently.

Twelfth Embodiment

Figure 16:
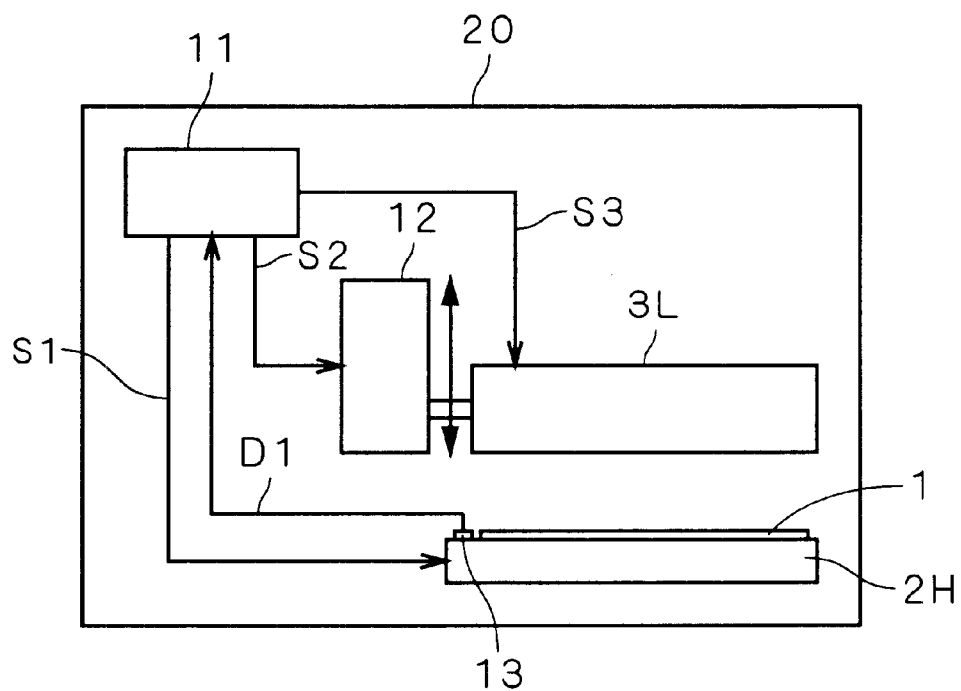
FIG. 16 is a block diagram typically showing a part of a structure of a burn-in device according to a twelfth embodiment of the present invention.

FIG. 16 is a block diagram typically showing a part of a structure of a burn-in device according to a twelfth embodiment of the present invention. A burn-in device 20 comprises a high temperature chuck 2H and a low temperature member 3L in the same manner as that in the ninth embodiment. In the twelfth embodiment, the high temperature chuck 2H is fixed. Moreover, the burn-in device 20 comprises a driving mechanism 12 for driving the low temperature member 3L in a vertical direction (and a transverse direction if necessary) and a controller 11 connected to the driving mechanism 12.

When a low temperature stress is to be applied to a wafer 1 at the Step SP21 in the burn-in method according to the eighth embodiment, the driving mechanism 12 drives the low temperature member 3L downward based on a control signal S2 sent from the controller 11. Consequently, the high temperature chuck 2H and the low temperature member 3L approach to each other as shown in FIG. 16 so that a low temperature stress is applied to the wafer 1.

Moreover, when the Step SP22 in the burn-in method according to the eighth embodiment is to be executed, the driving mechanism 12 drives the low temperature member 3L upward based on the control signal S2 sent from the controller 11. Consequently, the high temperature chuck 2H and the low temperature member 3L keep away from each other so that a high temperature stress is applied to the wafer 1. In addition, an electric stress is externally applied to the wafer 1.

While the description has been given to the example in which the burn-in device 20 according to the twelfth embodiment is constituted based on the burn-in device according to the ninth embodiment, the burn-in device 20 according to the twelfth embodiment can also be constituted based on the burn-in devices according to the tenth and eleventh embodiments.

According to the burn-in device 20 in accordance with the twelfth embodiment, thus, the moving speed and stop position of the low temperature member 3L are controlled by the controller 11 and the driving mechanism 12. Therefore, the low temperature stress to be applied to the wafer 1 by the low temperature member 3L can be controlled accurately.

Thirteenth Embodiment

Figure 17:
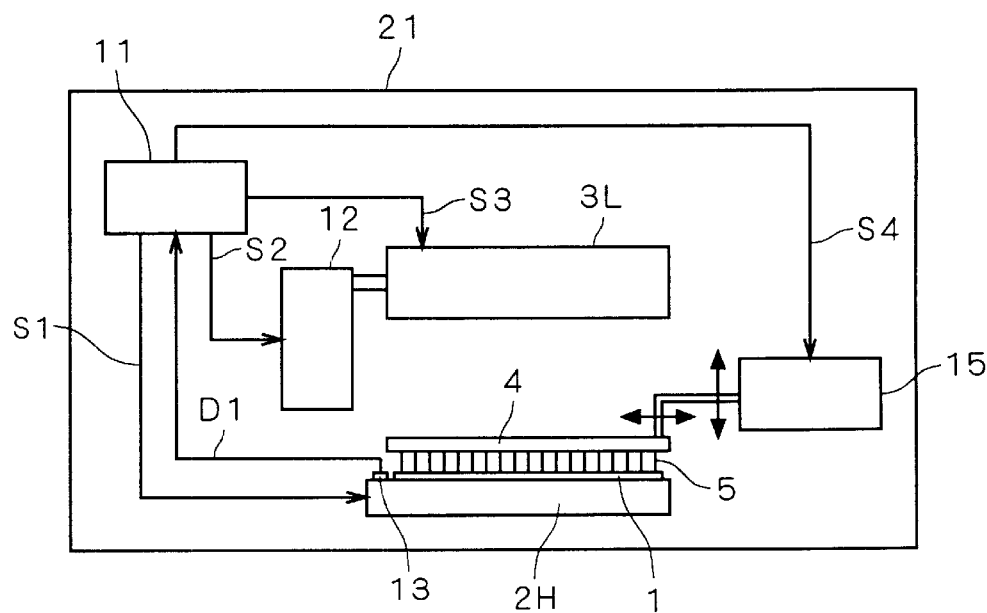
FIG. 17 is a block diagram typically showing a part of a structure of a burn-in device according to a thirteenth embodiment of the present invention.

FIG. 17 is a block diagram typically showing a part of a structure of a burn-in device according to a thirteenth embodiment of the present invention. A burn-in device 21 further comprises an electric stress applying portion to be controlled by a controller 11 based on the burn-in device 20 according to the twelfth embodiment. In the same manner as in the sixth embodiment, the electric stress applying portion includes a probe card 4 and a driving mechanism 15. The driving mechanism 15 is connected to the controller 11.

When the Step SP22 in the burn-in method according to the eighth embodiment is to be executed, the driving mechanism 12 drives a low temperature member 3L upward based on a control signal S2 sent from the controller 11 so that a high temperature stress is applied to a wafer 1 through a high temperature chuck 2H. In addition, the driving mechanism 15 drives the probe card 4 such that a probe needle 5 abuts on the wafer 1 based on a control signal S4 sent from the controller 11. Consequently, an electric stress is applied to the wafer 1 by the probe card 4.

According to the burn-in device 21 in accordance with the thirteenth embodiment, thus, the driving operation of the electric stress applying portion for applying the electric stress to the wafer 1 is also controlled by the controller 11. Therefore, it is possible to enhance controllability as a system of the whole burn-in device.

Fourteenth Embodiment

Figure 18:
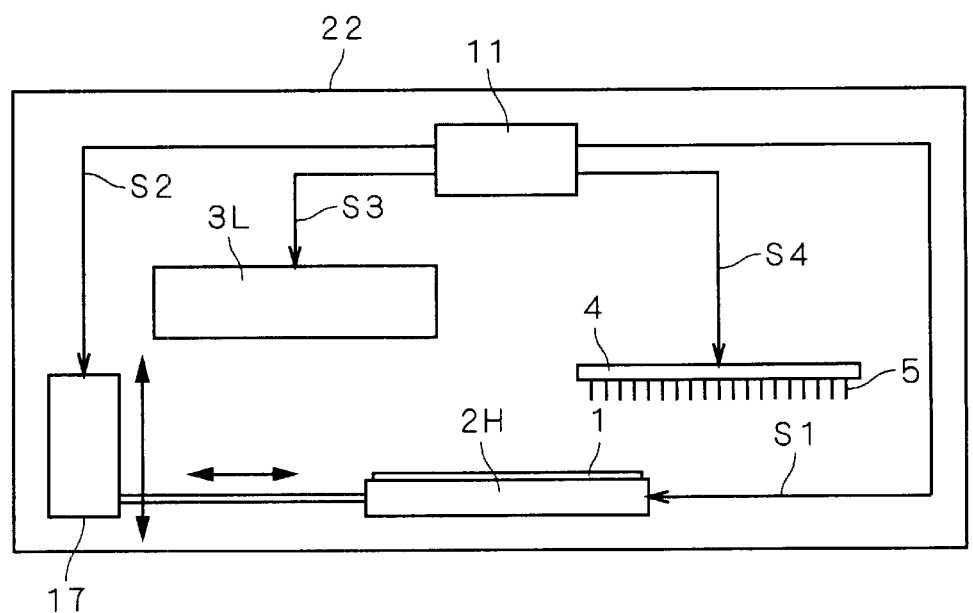
FIG. 18 is a block diagram typically showing a part of a structure of a burn-in device according to a fourteenth embodiment of the present invention.
Figure 19:
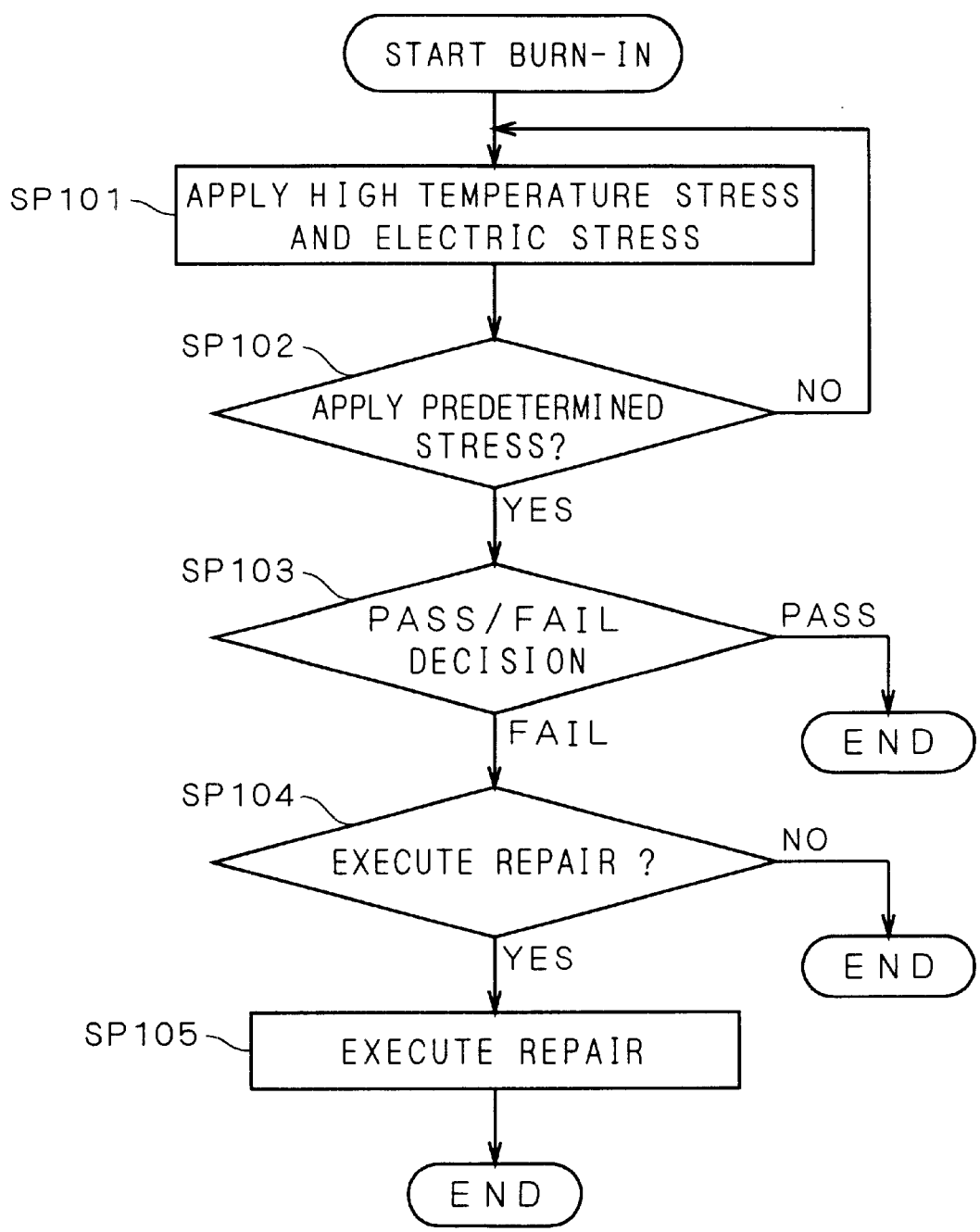
FIG. 19 is a flow chart for explaining a conventional burn-in method.
Figure 20:
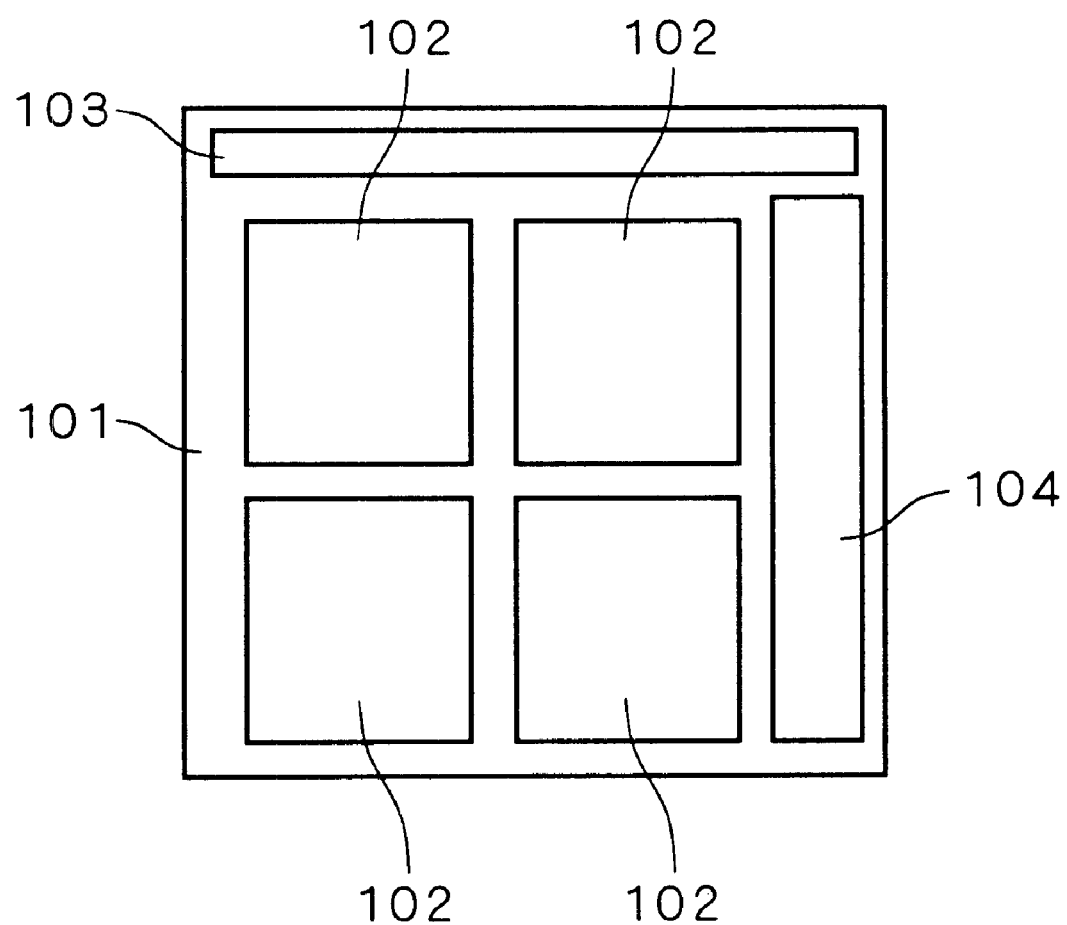

FIG. 18 is a block diagram typically showing a part of a structure of a burn-in device according to a fourteenth embodiment of the present invention. For simplicity of the drawings, the temperature sensor 13 shown in FIG. 16 is omitted. A burn-in device 22 comprises a high temperature chuck 2H and a low temperature member 3L in the same manner as that in the ninth embodiment. In the fourteenth embodiment, the low temperature member 3L is fixed. Moreover, the burn-in device 22 comprises a driving mechanism 17 for driving the high temperature chuck 2H in vertical and transverse directions. Furthermore, the burn-in device 22 comprises an electric stress applying portion having a probe card 4 fixed thereto. The driving mechanism 17 and the probe card 4 are connected to a controller 11.

When a low temperature stress is to be applied to a wafer 1 at the Step SP21 in the burn-in method according to the eighth embodiment, the driving mechanism 17 drives the high temperature chuck 2H to approach to the low temperature member 3L based on a control signal S2 sent from the controller 11. Consequently, the high temperature chuck 2H and the low temperature member 3L approach to each other so that the low temperature stress is applied to the wafer 1.

When a high temperature stress and an electric stress are to be applied to the wafer 1 at the Step SP22 in the burn-in method according to the eighth embodiment, the driving mechanism 17 drives the high temperature chuck 2H such that the wafer 1 abuts on a probe needle 5 based on the control signal S2 sent from the controller 11. Consequently, the high temperature stress is applied to the wafer 1 by the high temperature chuck 2H and the electric stress is applied to the wafer 1 by the probe card 4 based on a control signal S4 sent from the controller 11.

While the description has been given to the example in which the burn-in device 22 according to the fourteenth embodiment is constituted based on the burn-in device according to the ninth embodiment, the burn-in device 22 according to the fourteenth embodiment can also be constituted based on the burn-in devices according to the tenth and eleventh embodiments.

According to the burn-in device 22 in accordance with the fourteenth embodiment, thus, the application of the low temperature stress through the low temperature member 3L, the application of the high temperature stress through the high temperature chuck 2H and the application of the electric stress through the probe card 4 are controlled by the controller 11. Therefore, it is possible to enhance controllability as a system of the whole burn-in device.

While the invention has been shown and described in detail, the foregoing description is in all aspects illustrative and not restrictive. It is therefore understood that numerous modifications and variations can be devised without departing from the scope of the invention.

What is claimed is:

1. A burn-in device comprising:

one of a high temperature generating portion and a low temperature generating portion which has mounting surface where an evaluation object is to be mounted;

the other of said high temperature generating portion and said low temperature generating portion which is provided opposite to said mounting surface of said one of said high temperature generating portion and said low temperature generating portion and can be moved relatively to said one of said high temperature generating portion and said low temperature generating portion;

an electric stress applying portion for applying an electric stress to said evaluation object; and an evaluating portion for deciding whether a failure is generated on said evaluation object or not.

2. The burn-in device according to claim 1, wherein said other of said high temperature generating portion and said low temperature generating portion is provided with a plurality of through holes penetrating from one main surface opposed to said mounting surface to the other main surface.

3. The burn-in device according to claim 1, wherein said other of said high temperature generating portion and said low temperature generating portion partially applies a temperature stress to said evaluation object.

4. The burn-in device according to claim 1, further comprising a driving mechanism for driving at least one of said high temperature generating portion and said low temperature generating portion; and a control portion for controlling said driving mechanism.

5. The burn-in device according to claim 4, further comprising a temperature sensor connected to said control portion and provided close to said evaluation object.

6. The burn-in device according to claim 4, wherein said electric stress applying portion is connected to said control portion.

* * * * *

UNITED STATES PATENT AND TRADEMARK OFFICE
CERTIFICATE OF CORRECTION

PATENT NO. : 6,372,528 B1
DATED : April 16, 2002
INVENTOR(S) : Yamamoto

It is certified that error appears in the above-identified patent and that said Letters Patent is hereby corrected as shown below:

<u>Title page,</u>
Item [30] is incorrect. Item [30] should read:

-- [30]     Foreign Application Priority Data

Sept. 20, 2000  (JP) ………………………….. 2000-284645 --

Signed and Sealed this

Twenty-fourth Day of December, 2002

JAMES E. ROGAN
*Director of the United States Patent and Trademark Office*